United States Patent [19]
Beasom

[11] Patent Number: 4,694,313
[45] Date of Patent: Sep. 15, 1987

[54] CONDUCTIVITY MODULATED SEMICONDUCTOR STRUCTURE

[75] Inventor: James D. Beasom, Melbourne, Fla.

[73] Assignee: Harris Corporation, Melbourne, Fla.

[21] Appl. No.: 702,601

[22] Filed: Feb. 19, 1985

[51] Int. Cl.⁴ .................... H01L 29/48; H01L 29/78; H01L 27/02
[52] U.S. Cl. .................... 357/23.4; 357/15; 357/41; 357/46; 357/86
[58] Field of Search .............. 357/13, 15, 20, 23.4, 357/23.1, 38, 41, 42, 46, 86, 88, 14

[56] References Cited

U.S. PATENT DOCUMENTS

| | | | |
|---|---|---|---|
| 3,206,670 | 9/1965 | Atalla | 357/14 |
| 3,753,055 | 8/1973 | Yamashita et al. | 357/23.1 |
| 3,788,904 | 1/1974 | Haraszti | 357/15 |
| 4,035,826 | 7/1977 | Morton et al. | 357/42 |
| 4,152,717 | 5/1979 | Satou et al. | 357/42 |
| 4,199,774 | 4/1980 | Plummer | 357/41 |
| 4,203,126 | 5/1980 | Yim et al. | 357/42 |
| 4,300,152 | 6/1981 | Lepselter | 357/42 |
| 4,357,178 | 11/1982 | Bergeron et al. | 357/15 |
| 4,364,073 | 12/1982 | Becke et al. | 357/23.4 |
| 4,513,309 | 4/1985 | Cricchi | 357/41 |
| 4,521,795 | 12/1985 | Coe et al. | 357/46 |
| 4,543,596 | 9/1985 | Strach et al. | 357/41 |
| 4,550,332 | 10/1985 | Wagner | 357/38 |

Primary Examiner—J. Carroll
Attorney, Agent, or Firm—Barnes & Thornburg

[57] ABSTRACT

An insulated gate field effect transistor having a minority carrier diode and a majority carrier diode formed in the drain region. The minority diode modulates the resistance of the drain while the majority diode decreases sensitivity to latch up. Alternatively, a minority diode only is formed in the drain and separated from the drain contact and source by the body and body contact. An improved SCR is formed using the two diode structures as the fourth layer. An improved diode can also be formed having both low turn-on and low series resistance.

33 Claims, 10 Drawing Figures

CONDUCTIVITY MODULATED SEMICONDUCTOR STRUCTURE

BACKGROUND AND SUMMARY OF THE INVENTION

The present invention relates generally to semiconductor structures and more specifically to an improved semiconductor structure which is capable of conductivity modulation.

High voltage sustaining capability in a semiconductor device is usually achieved by use of a high resistivity region in the device in which most of the high sustaining voltage is handled. A disadvantage of this approach is that when current is flowing through the device a large voltage drop occurs in the high resistivity region since its bulk resistance is inversely proportional to its resistivity. In the prior art, the on resistance has been reduced by conductivity modulation of the high resistivity drain region. The minority carriers which modulate the drain resistivity are introduced by an integral PN diode which is in series with the drain. A top contact version of an NMOS embodying these principles is shown in FIG. 1. The P+ region labeled anode injects holes into the N drain region whose conductivity they increase. This structure is shown in FIG. 10 of U.S. Pat. No. 4,199,774 to Plummer.

There are several problems with this structure. One results from the presence of the anode (for N channel) or cathode (for P channel) which introduces a diode offset and non-linear small signal resistance to the zero offset linear resistance of the basic MOS device. The other arises from the parasitic SCR embedded in the structure. In FIG. 1, the SCR has P+ anode as anode, N bulk as N base, P body as NPN base and N source as cathode. At high current, the lateral voltage drops in the P body developed by the flow of collected holes to the body contact (injected by the anode) forward biases a portion of the N+ source to P body junction, thereby turning on the parasitic SCR. Once on, the SCR cannot be turned off by the MOS gate, thus defeating a major feature of the structure.

Thus, it is an object of the present invention to provide an insulated gate field effect transistor capable of sustaining high voltages with reduced latch sensitivity.

Another object of the present invention is to provide an insulated gate field effect transistor having modulated drain on resistance.

Yet another object of the present invention is to provide an insulated gate field effect transistor capable of withstanding high reverse blocking voltages.

Still another object of the present invention is to provide a conductivity modulated MOS structure with reduced latch up sensitivity which may be formed in an integrated circuit or as discreet devices.

An even further object of the present invention is to provide an SCR structure having an increased, controllable turn-off gain.

A still even further object of the present invention is to provide a diode structure having a lower turn-on voltage than a junction diode and a lower series resistance than a Schottky diode.

These and other objects of the invention are attained by providing a minority carrier diode and a majority carrier diode in the drain region with the minority carrier diode modulating the current path of the majority carrier diode. The diodes may be formed in a common surface of the drain region with the body and source region or may be formed on an opposed surface of the drain region. The minority carrier diode and the majority carrier diode may receive a common signal in which case the majority carrying diode should have a lower turn-on voltage than the minority carrying diode. The signal applied to the minority carrying diode should be less than the value which will produce latch up of the insulated gate field effect transistor structure. The minority carrier diode is positioned between the majority carrier diode and the body region. The majority diode may be formed as a Schottky diode or as a semiconductor junction diode.

Another embodiment is capable of current modulation using a minority carrier injecting diode and a separate drain contact. In this example, a drain contact is formed in the drain adjacent to the channel portion of the body. The anode of the minority carrier diode is formed in the drain region and is separated from the source region, formed in the body region, by the body contact. Here the insulated gate field effect transistor structure operates as a conventional transistor until a drain-to-source voltage greater than the voltage drop of the minority diode is reached. The diode begins to conduct and further increase of current flow will be through the diode. Since the source region is remote from the anode and separated by the body contact, very high anode current density can be handled without latch up.

An SCR structure having an increased, controllable turn-on gain is formed by providing a minority carrier diode and a majority carrier diode in the third layer of a four-layer device. The minority carrier diode is positioned between the second layer and the majority carrier diode and modulates the current path of the majority carrier diode.

A low turn-on voltage, low resistance diode is formed by providing a minority carrier junction in a substrate between the surface substrate contact and the majority carrier junction in the substrate. The majority carrier diode has a lower turn-on voltage and, thus, operates as a low turn-on diode until the voltage in the substrate reaches a point to which the minority carrier diode turns on. The minority carrier diode reduces the resistance by conductivity modulation.

Other objects, advantages and novel features of the present invention will become apparent from the following detailed description of the invention when considered in conjunction with the accompanying drawings.

DETAILED DESCRIPTION OF THE DRAWINGS

Figure 1:
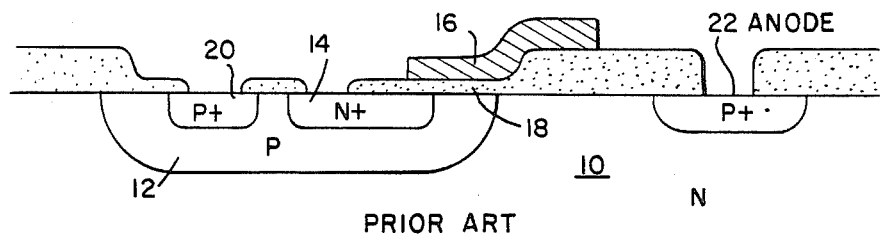
FIG. 1 is a cross-sectional view of an insulated gate field effect transistor triac structure of the prior art.

The basic insulated gate field effect transistor of the prior art including a diode connected in series with the drain to inject minority carriers is illustrated in FIG. 1. It includes an N-type drain region 10 in which a P body 12 is formed. An N+ source 14 is formed in the P body 12 and a gate 16 is formed over the portion of the body 12 between the source region 14 and the drain region 10 and is separated therefrom by a gate insulative layer 18. A P+ body contact 20 is formed in the body 12. A P+ anode 22 forms a junction diode with drain region 10. Although the anode region 22 of the diode introduces minority carriers and therefore increases the conductivity and reduces the on resistance, it also introduces a voltage drop. If a high enough signal is applied, the device latches on forming a parasitic SCR.

Figure 2:
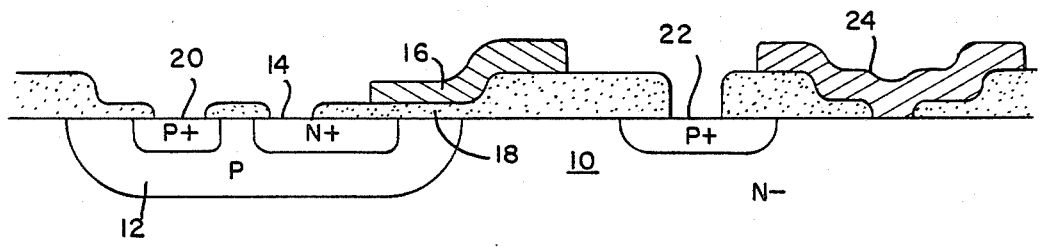
FIG. 2 is a cross-sectional view of an insulated gate field effect transistor incorporating the principles of the present invention.

As an effort to maintain the reduced on resistance and voltage drop of the drain while reducing the latch sensitivity, the present invention provides, as illustrated in FIG. 2, an insulated gate field effect transistor including a minority and a majority carrier diode. In addition to the drain region 10, body region 12, source region 14, gate 16, body contact 20, and a semiconductor anode 22, a Schottky diode is formed. This diode is formed by a Schottky anode metal 24 on the surface of the drain region 10. For the example shown in FIG. 2, the Schottky diode injects only majority carriers, which are electrons in this example while the P+ anode injects holes. It should be noted that in P channel devices the majority injecting carriers would be holes although the minority injecting carriers would be electrons.

There are several ways in which the structure may be operated. The input signal may be connected to the Schottky anode 24 while a current is supplied to the semiconductor anode 22 sufficient to produce the desired modulation of the drain resistance but too small to cause latch up. In this way, large anode currents can be handled without latch up because the large currents are electron current flow injected into the drain by the Schottky. By positioning the minority carrier diode 22 between the majority carrier diode 24 and the body 12, better control of the modulation is achieved.

Although the anode 22 is shown as just between the majority carrier diode 24 and the body 12, the anode 22 may be a ring surrounding the Schottky diode 24. This would increase the Schottky diode breakdown voltage.

Another mode of operation depends upon the lateral disposition of the semiconductor anode between the Schottky anode 24 and the body 12. The two anodes are connected and current injected into the common node. The Schottky is made to have a lower built-in potential, and therefore lower turn-on voltage, than the P+ – N diode. In this case, current will initially flow only through the Schottky then laterally through the N− drain to the gate induced channel on the body surface. A lateral voltage drop is developed between the two anodes in the N− by this flow. When the voltage drop equals the difference between the built-in voltages of the two diodes, the semiconductor anode will begin to conduct by injecting holes into the N−. The injected holes will reduce drain resistance by conductivity modulation.

As current is further increased, a balance will be maintained between the current flows through the two anodes. Enough current will flow through the P+ anode to reduce the N− resistance enough to hold the voltage difference between the two anodes at the value which balances their difference forward voltages. All other current will flow through the Schottky anode 24. If the source 14 and body 12 are tied together, the structure would be a three terminal device.

A higher current at onset of latch up is achieved because much of the total current flows by majority carriers injected by the Schottky anode 24. A lower offset is obtained because the Schottky has a lower turn-on voltage than the semiconductor diode. The ratio of current flow between the two anodes can be adjusted by changing the spacing between anodes or by changing their area ratio among other methods.

Figure 3:
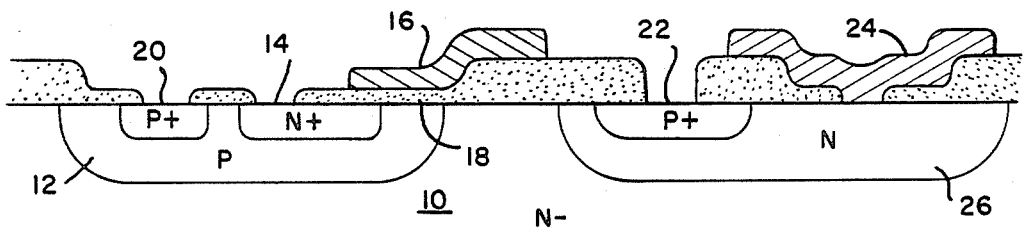
FIG. 3 is a cross-sectional view of an insulated gate field effect transistor with a punch-through shield incorporating the principles of the present invention.

FIG. 3 illustrates a modification to the structure of FIG. 2 in which an N punch-through shield 26 has been added. The Schottky may be formed on the shield 24 as shown or on N drain material 10. A non-selective surface N region with field plates may also be used for the punch-through shield.

The structure of FIGS. 2 and 3 have the capability of blocking high reverse voltages, namely large negative anode-to-source voltage for an N channel or large positive cathode-to-source voltage for P channel devices. This is accomplished by using the step oxide field plate on the anode region 22 and the Schottky anode 24.

Figure 4:
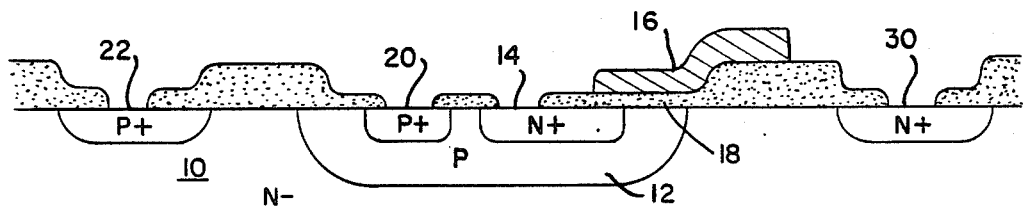
FIG. 4 is a cross-sectional view of an insulated gate field effect transistor structure incorporating the principles of the present invention using a single diode.

An improved structure which eliminates offset while retaining conductivity modulation is illustrated in FIG. 4. The device has a minority carrier diode on one side of the body and a conventional drain contact 30 on the other. Signal current is injected into both. When drain source voltage is less than a diode drop, current flows through the conventional MOS part of the device. When drain source voltage is greater than a diode drop, the anode begins to conduct and most further increase in device current flows through it. A feature of the structure of FIG. 4 is that the source region 14 is remote from the anode and separated from it by the body contact. This allows very high anode current density without latch up, but increases the voltage drop for the electron flow to the anode junction which is supplied by the source to the N drain by the gate induced channel.

Figure 5:
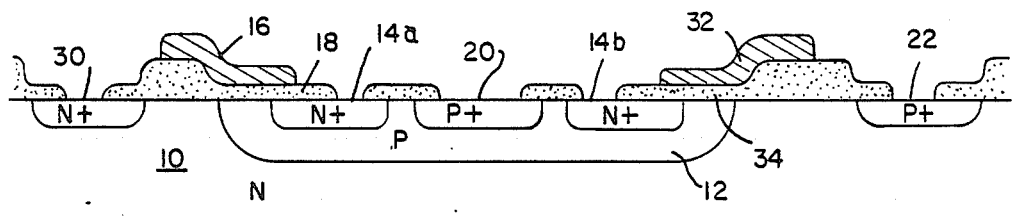
FIG. 5 is a cross-sectional view of an insulated gate field effect transistor structure which is a modification of FIG. 4.

A modification of the device of FIG. 4 is illustrated in FIG. 5. The source region is formed as a pair of source regions 14a and 14b in the body to region 12 with the body contact 20 therebetween. In addition to the original gate 16 over the channel region between the drain contact 30 and the source contact 14a, a second or anode gate 32 is formed over the body region 12 between the source contact 14b and the drain region 10 adjacent to the anode 22. The gate 32 is separated from the surface of the body 12 by a gate oxide 34.

Figure 6:
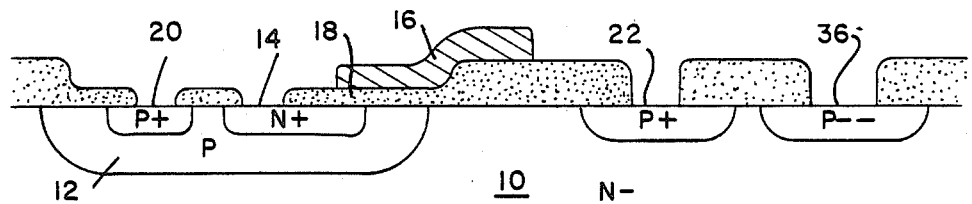
FIG. 6 is a cross-sectional view of an insulated gate field effect transistor incorporating the principles of the present invention using two semiconductor diodes.

Although the majority carrier diode has been illustrated in FIGS. 2 and 3 as including a Schottky diode, other majority diodes may be formed. As illustrated in FIG. 6, the majority diode is formed by a majority anode 36 being formed by P— — region in the N— drain 10. The notation of P— — relative to the N— drain region 10 indicates that the majority anode 36 has a lower impurity concentration than the drain region 10. It should be noted that while the P+ minority anode 22 and the P— — majority anode 36 or Schottky contact 24 are minority and majority carriers injectors in the N— drain regions, if the drain region is P type, minority and majority cathode regions would be minority and majority receptors although the diodes would still be minority and majority diodes operating as a primary signal source and a modulation signal.

Figure 7:
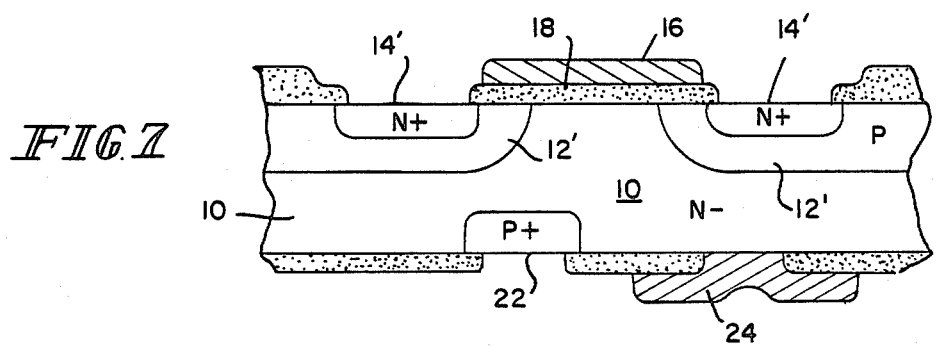
FIG. 7 is a cross-sectional view of a vertical insulated gate field effect transistor incorporating the principles of the present invention.
Figure 8:
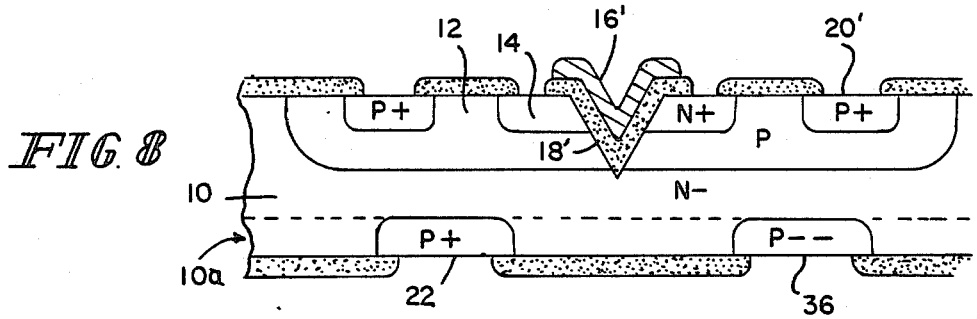
FIG. 8 is a cross-sectional view of another vertical insulated gate field effect transistor incorporating the principles of the present invention.

In addition to the lateral insulated gate field effect transistor devices, the present invention is also applicable to vertical insulated gate field effect transistor devices as illustrated in FIGS. 7 and 8. The vertical device of FIG. 7 includes an annulus body 12' in which is formed an annulus source 14'. Semiconductor diode 22 and the Schottky diode 24 are formed on a surface of the drain region 10 opposite that in which the body region 12' and source region 14' are formed. In FIG. 8, the vertical insulated gate field effect transistor includes a vertical gate 16' on vertical insulative gate layer 18' extending from the surface through the source region 14 and the body region 12 substantially to the drain region 10. The minority diode having anode 22 and the majority diode having anode 36 are shown as semiconductor devices. An area of increased N+ impurities 10a, as illustrated by the dotted line in FIG. 8, is provided at the surface in which the minority anode 22 and majority anode 36 are formed.

If the two diodes of FIGS. 7 and 8 are tied together, the turn-on can be set by adjusting the areas of the two diode types so that the desired current ratio is achieved taking into account the higher current density of a low barrier height Schottky diode or P— — to an N majority carrier injecting diode to a minority injecting diode.

Figure 9:
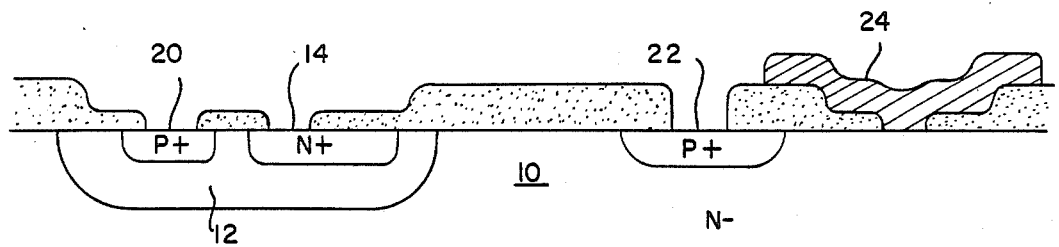
FIG. 9 is a cross-sectional view of an SCR incorporating the principles of the present invention.

Although the description of the preferred embodiments so far have been directed to insulated gate field effect transistors, the principle is also applicable to silicon controlled rectifiers (SCR) as well as diodes. As illustrated in FIG. 9, the four-layer SCR device includes a first layer or cathode N+ region 14 formed in a second layer or P gate region 12 which is formed in a third layer or N— gate region 10. The fourth layer of the SCR structure includes the anode SCR contact 24 which forms the majority carrier diode. A minority carrier anode includes P+ region 22 formed in the third layer 10. Although the four regions are not layers, they are referred to as layers since an SCR is known generically as a four-layer device. A P+ gate contact region 20 is formed in the P gate 12. In the structure of FIG. 9, the gate turn-off gain is increased by the control of the amount of injected minority carriers. Since some of the device current is majority carriers provided by the majority carrier diode rather than all the current being from the minority carrier diode as in the conventional SCR turn-off gain control is provided. The various means for biasing the two diodes are described above for the insulated gate field effect transistor.

Figure 10:
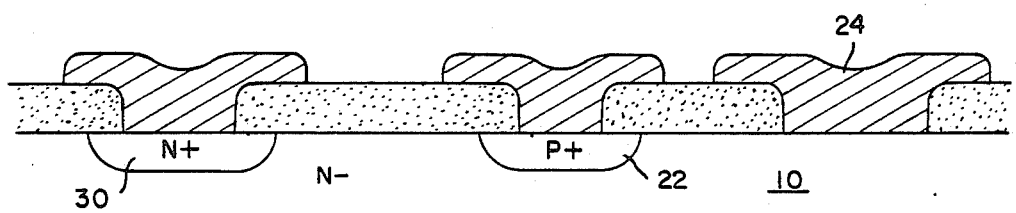
FIG. 10 is a cross-sectional view of a diode incorporating the principles of the present invention.

Another application of the two diode concept of the present invention is illustrated in FIG. 10 to provide a lower turn-on voltage than a PN junction diode and a lower series resistance than a Schottky diode. The diode structure includes an N— cathode region 10 having an N+ cathode contact 30, a majority carrier diode having Schottky contact 24 and a minority carrier diode having P+ anode region 22. The minority carrier injecting region 22 is placed between the substrate contact 30 and the majority injecting junction 24. The majority carrier diode 24 has a lower turn-on voltage than the minority carrier injection junction 22. In operation, when the two junctions are connected together, current flows initially through the majority carrier junction. When the voltage drop developed in the substrate between the two junctions by the lateral flow of majority carriers to the substrate contact 30 reaches the difference in turn-on voltage of the two junctions, the minority carrier junction 22 begins to conduct. The minority carriers injected into the substrate 10 reduces its resistance by conductivity modulation. In this way the low turn-on voltage of the majority carrier diode is combined with the low series resistance, and thus low diode voltage at high currents of the minority carrier diode in a single substrate.

From the preceding description of the preferred embodiments, it is evident that the objects of the invention are attained, and although the invention has been described and illustrated in detail, it is to be clearly understood that the same is by way of illustration and example only and is not to be taken by way of limitation. The spirit and scope of the invention are to be limited only by the terms of the appended claimed is.

What is claimed is:

1. An insulated gate field effect transistor comprising:
   source and drain regions of a first conductivity type separated by a body region of a second conductivity type;
   a gate over a portion of said body region between said source and drain regions and separated from said body by an insulation layer; and
   a minority carrier diode and a majority carrier diode both formed with said drain region in series with a PN junction formed by said drain and body regions.

2. An insulated gate field effect transistor according to claim 1, wherein said minority and majority carrier diodes are junction diodes.

3. An insulated gate field effect transistor according to claim 1, wherein said majority carrier diode is a Schottky barrier diode and said minority carrier diode is a junction diode.

4. An insulated gate field effect transistor according to claim 1, including means for applying an input signal to said majority carrier diode and a modulation signal to said minority carrier diode.

5. An insulated gate field effect transistor according to claim 4, wherein at least a portion of said minority carrier diode is positioned in said drain region between majority carrier diode and said body region.

6. An insulated gate field effect transistor according to claim 4, wherein said means applies a modulation signal less than a value which will produce latch up.

7. An insulated gate field effect transistor according to claim 1, including means for applying a single signal to said diodes.

8. An insulated gate field effect transistor according to claim 7, wherein one of said diodes is an input diode and the other of said diodes is a modulation diode and at least a portion of said modulation diode is positioned in said drain region between said input diode and said body region.

9. An insulated gate field effect transistor according to claim 8, wherein said input diode has a lower turn-on voltage than said modulation diode.

10. An insulated gate field effect transistor according to claim 1, wherein one of said diodes is an input diode and the other of said diodes is a modulation diode and at least a portion of said modulation diode is positioned in said drain region between said input diode and said body region.

11. An insulated gate field effect transistor according to claim 10, wherein said input diode has a lower turn-on voltage than said modulation diode.

12. An insulated gate field effect transistor according to claim 1, including a shield region of said first conductivity type and having a higher impurity concentration than said drain region in said drain region, and said minority diode is formed in said shield region and separated from said drain region by said shield region.

13. An insulated gate field effect transistor according to claim 1, wherein said body region is formed in said drain region and has a higher impurity concentration than said drain region and said source region is formed in said body region and has a higher impurity concentration than said body region.

14. An insulated gate field effect transistor according to claim 1, wherein said diodes are formed on a surface opposite of said drain opposite a surface of said drain in which said body and source regions are formed.

15. An insulated gate field effect transistor according to claim 1, wherein said diodes, source region and body region are formed in a common surface of said drain region.

16. An insulated gate field effect transistor comprising:
source and drain regions of a first conductivity type separated by a body region of a second conductivity type;
a gate over a channel portion of said body region between said source and drain regions and separated from said body by an insulation layer;
a drain contact in said drain region adjacent said channel; and
a minority carrier diode in said drain region in series with a PN junction formed by said drain and body regions and laterally separated from said drain contact by said body region.

17. An insulated gate field effect transistor according to claim 16, including a body contact in said body region between said source region and said diode.

18. An insulated gate field effect transistor according to claim 17, wherein said body contact includes a contact region of said second conductivity type having a higher impurity concentration than said body region.

19. An insulated gate field effect transistor according to claim 16, wherein said source region includes a first and second source portion adjacent opposed edges of said body region and said gate includes a first and second gate portion over body portions adjacent said opposed edges.

20. An insulated gate field effect transistor according to claim 19, wherein said drain contact is adjacent one of said opposed edges and said diode is adjacent the other of said opposed edges.

21. An insulated gate field effect transistor according to claim 20, including a body contact to said body between said first and second source portions.

22. A silicon controlled rectifier comprising:
a first region of a first conductivity type formed in a second region of a second conductivity type;
said second region being in a third region of said first conductivity type;
a minority carrier diode and a majority carrier diode both being formed with said third region in a series with a PN junction formed by said second and third regions; and
said first, second and third regions and said majority carrier diode forming said silicon controlled rectifier.

23. A silicon controlled rectifier according to claim 22, wherein said minority and majority carrier diodes are junction diodes.

24. A silicon controlled rectifier according to claim 22, wherein said majority carrier diode is a Schottky barrier diode and said minority carrier diode is a junction diode.

25. A silicon controlled rectifier according to claim 22, including means for applying an input signal to said majority carrier diode and a modulation signal to said minority carrier diode.

26. A silicon controlled rectifier according to claim 25, wherein at least a portion of said minority carrier diode is positioned in said third region between majority carrier diode and said second region.

27. A diode comprising:
a first region of a first conductivity type;
a contact region of a first conductivity type in said first region;
a minority carrier diode and a majority carrier diode formed with said first region,
means for applying an input signal to said majority carrier diode and a modulation signal to said minority carrier diode.

28. A diode according to claim 27, wherein at least a portion of said minority carrier diode is positioned in said first region between majority carrier diode and said contact region.

29. A diode according to claim 27, wherein said input diode has a lower turn-on voltage than said modulation diode.

30. A diode comprising:
a first region of a first conductivity type;
a contact region of a first conductivity type in said first region;
a minority carrier diode and a majority carrier diode formed with said first region,
one of said diodes is an input diode and the other of said diodes is a modulation diode and at least a portion of said modulation diode is positioned in said first region between said input diode and said contact region.

31. A diode according to claim 30, wherein said input diode has a lower turn-on voltage than said modulation diode.

32. A diode according to claim 30, wherein said minority and majority carrier diodes are junction diodes.

33. A diode according to claim 30, wherein said majority carrier diode is a Schottky barrier diode and said minority carrier diode is a junction diode.

* * * * *